US009923085B2

(12) United States Patent
Yoo et al.

(10) Patent No.: US 9,923,085 B2
(45) Date of Patent: Mar. 20, 2018

(54) METHOD FOR MANUFACTURING A THIN FILM TRANSISTOR AND AN ARRAY SUBSTRATE, AND CORRESPONDING DEVICES

(71) Applicant: Boe Technology Group Co., Ltd., Beijing (CN)

(72) Inventors: Seongyeol Yoo, Beijing (CN); Youngsuk Song, Beijing (CN); Heecheol Kim, Beijing (CN); Seungjin Choi, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/785,397

(22) PCT Filed: Jan. 30, 2015

(86) PCT No.: PCT/CN2015/071977
§ 371 (c)(1),
(2) Date: Oct. 19, 2015

(87) PCT Pub. No.: WO2016/074349
PCT Pub. Date: May 19, 2016

(65) Prior Publication Data
US 2016/0343835 A1 Nov. 24, 2016

(30) Foreign Application Priority Data
Nov. 13, 2014 (CN) .......................... 2014 1 0641116

(51) Int. Cl.
H01L 21/38 (2006.01)
H01L 29/786 (2006.01)
(Continued)

(52) U.S. Cl.
CPC ...... H01L 29/66969 (2013.01); H01L 21/477 (2013.01); H01L 21/82 (2013.01);
(Continued)

(58) Field of Classification Search
CPC ............. H01L 27/1225; H01L 29/7869; H01L 29/41733; H01L 29/45; H01L 27/124; H01L 29/66969; G02F 1/1368
(Continued)

(56) References Cited

U.S. PATENT DOCUMENTS

2008/0203387 A1 8/2008 Kang et al.
2010/0025678 A1* 2/2010 Yamazaki ........... H01L 27/1225
257/43
(Continued)

FOREIGN PATENT DOCUMENTS

CN 102651401 A * 8/2012 ......... H01L 29/7869
CN 102683423 9/2012
(Continued)

OTHER PUBLICATIONS

Yuan (Patent document CN102651401A)—machine translation.*
(Continued)

Primary Examiner — Kimberly Rizkallah
Assistant Examiner — Brian Turner
(74) Attorney, Agent, or Firm — Calfee, Halter & Griswold LLP

(57) ABSTRACT

The present invention relates to a method for manufacturing a thin film transistor and an array substrate, and corresponding devices. In the thin film transistor manufacturing process, the base substrate is annealed after the formation of the patterns of the active layer, the source and the drain in the thin film transistor, so as to thermally diffuse ions of the source and the drain at an ohmic contact between the active layer and the source, as well as the drain, to the active layer,
(Continued)

and further to provide the active layer with ions of the source and the drain for changing the components of the active layer, which reduces the resistance at the ohmic contact between the active layer and the source, as well as the drain, and guarantees the uniformity and reliability of the thin film transistor. Moreover, annealing treatment is relatively simpler in implementation as compared with the plasma treatment, and will not increase the complexity of the method for manufacturing the entire thin film transistor, which is good for thin film transistor production efficiency.

8 Claims, 6 Drawing Sheets

(51) Int. Cl.
| | |
|---|---|
| *H01L 21/336* | (2006.01) |
| *H01L 29/66* | (2006.01) |
| *H01L 29/24* | (2006.01) |
| *H01L 29/221* | (2006.01) |
| *H01L 21/441* | (2006.01) |
| *H01L 21/82* | (2006.01) |
| *H01L 21/477* | (2006.01) |
| *H01L 27/12* | (2006.01) |

(52) U.S. Cl.
CPC ...... *H01L 27/1225* (2013.01); *H01L 27/1259* (2013.01); *H01L 29/786* (2013.01); *H01L 29/7869* (2013.01)

(58) Field of Classification Search
USPC ............... 349/46; 257/43; 438/158, 104
See application file for complete search history.

(56) References Cited

U.S. PATENT DOCUMENTS

| | | | |
|---|---|---|---|
| 2013/0271690 A1* | 10/2013 | Matsukizono | ...... H01L 27/1225 349/46 |
| 2014/0138678 A1* | 5/2014 | Ito | ...... H01L 29/7869 257/43 |

FOREIGN PATENT DOCUMENTS

| | | |
|---|---|---|
| CN | 103000530 | 3/2013 |
| CN | 103050412 | 4/2013 |
| CN | 103730346 | 4/2014 |
| JP | H0945925 | 2/1997 |

OTHER PUBLICATIONS

International Search Report and Written Opinion from PCT/CN15/71977 dated Aug. 29, 2015.
Office action from Chinese Application No. 201410641116.3 dated Aug. 26, 2016.
Office Action from China Application No. 201410641116.3 dated Jan. 20, 2017.
Decision of Rejection for Chinese Patent Application No. 2014106411163 dated May 12, 2017.

* cited by examiner

METHOD FOR MANUFACTURING A THIN FILM TRANSISTOR AND AN ARRAY SUBSTRATE, AND CORRESPONDING DEVICES

CROSS-REFERENCE TO RELATED APPLICATIONS

The present application is the U.S. national phase entry of PCT/CN2015/071977, filed Jan. 30, 2015, which claims the benefit of Chinese Patent Application No. 201410641116.3, filed Nov. 13, 2014, the entire disclosures of which are incorporated herein by reference.

FIELD OF THE INVENTION

The present invention relates to the field of display technology, particularly to a method for manufacturing a thin film transistor (TFT) and an array substrate, and corresponding devices.

BACKGROUND OF THE INVENTION

At present, people are quite familiar with display devices, such as liquid crystal displays (LCDs), EL (electroluminescence) displays and electronic paper. These display devices have thin-film transistors (TFTs) for controlling respective pixel switches as shown in FIG. 1, the TFT mainly comprises a gate 1, an active layer 2, a source 3 and a drain 4, wherein a gate insulating layer 5 is arranged between the gate 1 and the active layer 2, and the source 3 and the drain 4 are arranged in the same layer and in electrical connection with the active layer 2 respectively.

In the structure of the TFT as shown in FIG. 1, the resistance at the ohmic contact a between the active layer and the source, as well as the drain, has a great influence on the reliability and uniformity of the TFT. Thus, when making the TFT, those skilled in the art utilize many methods in an attempt to reduce the resistance at the ohmic contact a between the active layer and the source, as well as the drain, one method of which is to reduce the components of oxygen atoms in the active layer by means of plasma treatment, so that the active layer has an effect like having n+ amorphous silicon layers in order to reduce the resistance at the ohmic contact a between the active layer and the source, as well as the drain. However, the plasma treatment is so complicated that it increases the complexity of the TFT manufacturing process and affects the uniformity and stability of the active layer, which is disadvantageous to the TFT production efficiency.

Thus, how to reduce the resistance at the ohmic contact between the active layer and the source, as well as the drain, without increasing the complexity of the TFT manufacturing process is an urgent problem to be solved by those skilled in the art.

SUMMARY OF THE INVENTION

The examples of the present invention provide a method for manufacturing a TFT and an array substrate, and corresponding devices, so as to reduce the resistance at the ohmic contact between the active layer and the source, as well as the drain, in the TFT.

An example of the present invention provides a method for manufacturing a TFT, comprising the steps of: forming patterns of a gate, an active layer, a source and a drain on a base substrate, wherein the source and the drain are in electrical connection with the active layer respectively, and further annealing the base substrate after the formation of the patterns of the active layer, the source and the drain, so as to thermally diffuse ions of the source and the drain at the ohmic contact between the active layer and the source, as well as the drain, to the active layer.

In relation to the method for manufacturing the TFT according to the example of the present invention, in the TFT manufacturing process, the base substrate is annealed after the formation of the patterns of the active layer, the source and the drain in the TFT, so as to thermally diffuse ions of the source and the drain at the ohmic contact between the active layer and the source, as well as the drain, to the active layer, and further to provide the active layer with ions of the source and the drain for changing the components of the active layer, which reduces the resistance at the ohmic contact between the active layer and the source, as well as the drain, and guarantees the uniformity and reliability of the TFT. Moreover, annealing treatment is relatively simpler in implementation as compared with the plasma treatment, and will not increase the complexity of the method for manufacturing the entire TFT, which is good for TFT production efficiency.

In a potential embodiment, in the method for manufacturing the TFT according to the example of the present invention, the base substrate is annealed, to be specific, the base substrate is heated for a preset period of time and then naturally cooled to a room temperature in a protective gas or vacuum environment.

In a potential embodiment, in the method for manufacturing the TFT according to the example of the present invention, the preset period of time for the annealing treatment lasts from 20 minutes to 60 minutes.

In a potential embodiment, in the method for manufacturing the TFT according to the example of the present invention, the source and the drain are made of copper, titanium or molybdenum, and the active layer is made of semi-conductive oxides.

In a potential embodiment, in the method for manufacturing the TFT according to the example of the present invention, when the source and the drain are made of copper, the heating temperature of the base substrate ranges from 300 Celsius degrees to 350 Celsius degrees;

when the source and the drain are made of titanium or molybdenum, the heating temperature of the base substrate is below 300 Celsius degrees.

In a potential embodiment, in the method for manufacturing the TFT according to the example of the present invention, patterns of the source and the drain are formed after the formation of the pattern of the active layer; or the pattern of the active layer is formed after the formation of the patterns of the source and the drain.

In a potential embodiment, the method for manufacturing the TFT according to the example of the present invention further comprises, after the formation of the pattern of the active layer and before the formation of the patterns of the source and the drain, the step of:

forming a pattern of an insulating layer on the base substrate formed with the pattern of the active layer, the source and the drain being respectively electrically connected with the active layer by the through-holes in the insulating layer.

An example of the present invention provides a TFT made by the method for manufacturing the TFT as described above.

An example of the present invention provides a method for manufacturing an array substrate, comprising the steps of: forming a pattern of a TFT on a base substrate, forming patterns of a passivation layer and a pixel electrode in turn on the pattern of the TFT, the step of forming the pattern of the passivation layer specifically comprising the steps of:

forming a passivation layer film on the pattern of the TFT;

annealing the base substrate formed with the passivation layer film, so as to thermally diffuse the ions of the source and the drain at the ohmic contact between the active layer and the source, as well as the drain, of the TFT to the active layer; and patterning the annealed passivation layer film to form the pattern of the passivation layer.

In the method for manufacturing the array substrate according to the example of the present invention, the base substrate is annealed after the formation of the passivation layer film, so as to thermally diffuse ions of the source and the drain at the ohmic contact between the active layer and the source, as well as the drain, to the active layer, and further to provide the active layer with ions of the source and the drain for changing the components of the active layer, which reduces the resistance at the ohmic contact between the active layer and the source, as well as the drain, and guarantees the uniformity and reliability of the TFT. During the annealing treatment after the formation of the passivation layer film, the passivation layer film isolates the source and the drain from oxygen so as to avoid oxidation reaction of the source and the drain during the annealing treatment.

An example of the present invention provides an array substrate made by the method for manufacturing the array substrate as described above.

DETAILED DESCRIPTION OF THE INVENTION

Figure 1:
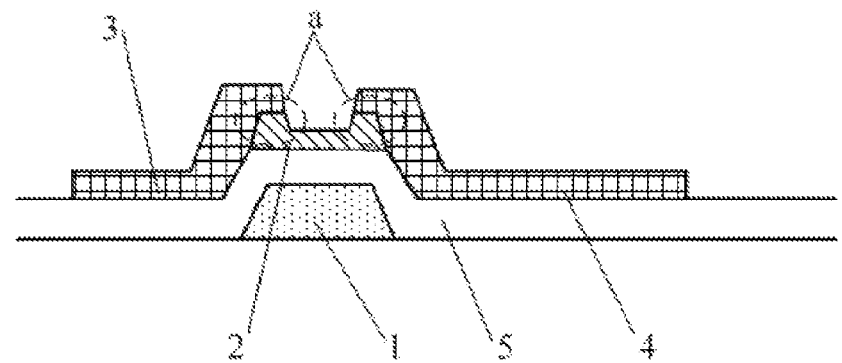
FIG. 1 is a structural schematic view of an existing TFT.

The embodiments regarding a TFT, an array substrate and a method for manufacturing the same will be described in detail with reference to the drawings.

The thickness of the layers and films, as well as the sizes and shapes thereof, in the drawings is not intended to reflect the real proportion of the components of the TFT and the array substrate, but to schematically explain the contents of the invention.

An example of the present invention provides a method for manufacturing a TFT, comprising the steps of: forming patterns of a gate, an active layer, a source and a drain on a base substrate, wherein the source and the drain are in electrical connection with the active layer respectively, and further annealing the base substrate after the formation of the patterns of the active layer, the source and the drain, so as to thermally diffuse ions of the source and the drain at the ohmic contact between the active layer and the source, as well as the drain, to the active layer.

According to the method for manufacturing the TFT according to the example of the present invention, in the TFT manufacturing process, the base substrate is annealed after the formation of the patterns of the active layer, the source and the drain in the TFT, so as to thermally diffuse ions of the source and the drain at the ohmic contact between the active layer and the source, as well as the drain, to the active layer, and further to provide the active layer with ions of the source and the drain for changing the components of the active layer, which reduces the resistance at the ohmic contact between the active layer and the source, as well as the drain, and guarantees the uniformity and reliability of the TFT. Moreover, annealing treatment is relatively simpler in implementation as compared with the plasma treatment, and will not increase the complexity of the method for manufacturing the entire TFT, which is good for TFT production efficiency.

To be specific, the TFT made by the method for manufacturing the TFT according to the example of the present invention can be a bottom-gate TFT or a top-gate TFT, which will not be defined herein.

Figure 2A:
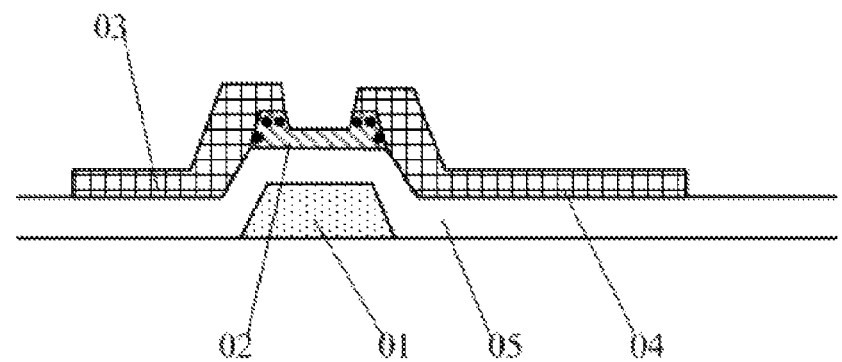
FIG. 2a is a structural schematic view of a bottom-gate TFT according to an example of the present invention.

The structure of the bottom-gate TFT, as shown in FIG. 2a, specifically comprises a gate 01, an active layer 02, a source 03 and a drain 04 arranged in turn on the base substrate, wherein a gate insulating layer 05 is usually provided between the gate 01 and the active layer 02. When implementing specifically, an insulating layer can be selected to be arranged between the active layer 02 and the film layer where the source 03 and the drain 04 are located according to the materials used for making the active layer 02, as well as the source 03 and the drain 04, and the source 03 and the drain 04 are respectively electrically connected with the active layer 02 by through-holes in the insulating layer; or the active layer 02 and the film layer where the source 03 and the drain 04 are located can be selected to be in direct contact. The relative positions of the active layer 02 and the film layer where the source 03 and the drain 04 are located can be exchanged, i.e., the pattern of the active layer 02 is made before making the patterns of the source 03 and the drain 04; or the patterns of the source 03 and the drain 04 are made before making the pattern of the active layer 02, which will not be defined herein.

Figure 2B:
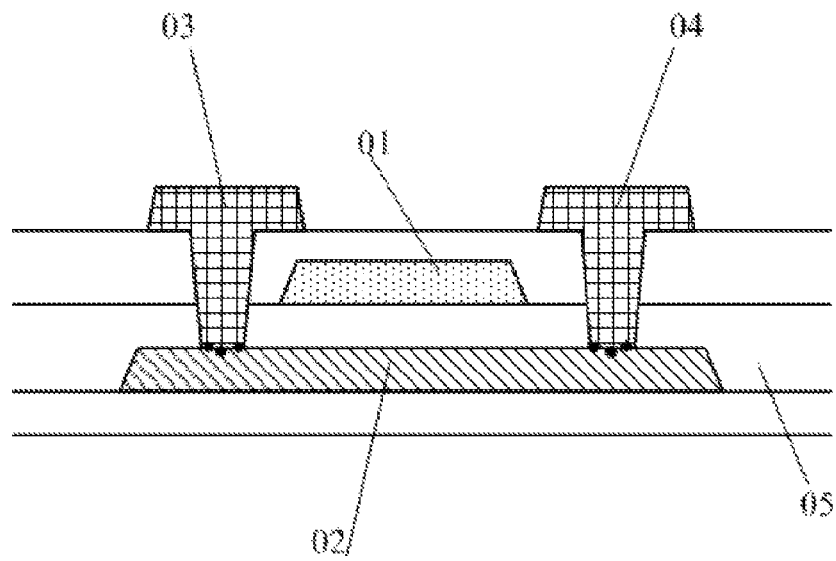
FIG. 2b is a structural schematic view of a top-gate TFT according to another example of the present invention.

The structure of the top-gate TFT, as shown in FIG. 2b, specifically comprises an active layer 02, a gate 01, a source 03 and a drain 04 arranged in turn on the base substrate, wherein a gate insulating layer 05 is usually provided between the active layer 02 and the gate 01. When implementing specifically, an insulating layer can be selected to be arranged between the active layer 02 and the film layer where the source 03 and the drain 04 are located according to the materials used for making the active layer 02, as well as the source 03 and the drain 04, and the source 03 and the drain 04 are respectively electrically connected with the active layer 02 by through-holes in the insulating layer; or the active layer 02 and the film layer where the source 03 and the drain 04 are located can be selected to be in direct contact. The relative positions of the gate 01 and the film layer where the source 03 and the drain 04 are located can be exchanged, i.e., the pattern of the gate 01 is made before making the patterns of the source 03 and the drain 04; or the patterns of the source 03 and the drain 04 are made before making the pattern of the gate 01, which will not be defined herein.

No matter for making the top-gate TFT or the bottom-gate TFT by the method for manufacturing the TFT according to the example of the present invention, the base substrate is annealed after the formation of the patterns of the active layer, the source and the drain in the TFT, so as to thermally diffuse ions of the source and the drain at the ohmic contact between the active layer and the source, as well as the drain, to the active layer, and further to provide the active layer with ions of the source and the drain for changing the components of the active layer, which reduces the resistance at the ohmic contact between the active layer and the source, as well as the drain, and guarantees the uniformity and reliability of the TFT.

The method for manufacturing the TFT according to the example of the present invention will be explained in detail by taking the structure of the bottom-gate TFT for example.

Specifically, in the method for manufacturing the TFT according to the example of the present invention, for the purpose of preventing the source 03 and the drain 04 from oxidation reaction during the annealing treatment, the base substrate, when annealed, is usually heated for a preset period of time and then naturally cooled to a room temperature in a protective gas or vacuum environment, wherein the protective gas is nitrogen or an inert gas such as helium, which will not be defined herein, and the room temperature is usually about 20 degrees.

Further, in the method for manufacturing the TFT according to the example of the present invention, for the purpose of thermally diffusing the ions of the source 03 and the drain 04 at the ohmic contact between the active layer 02 and the source 03, as well as the drain 04, to the active layer 02, the preset period of time for annealing the base substrate usually lasts from 20 minutes to 60 minutes optimally.

Specifically, in the method for manufacturing the TFT according to the example of the present invention, the source 03 and the drain 04 can be made of metallic materials, such as copper, titanium or molybdenum, and the active layer 02 can be made of semi-conductive oxides, such as indium gallium zinc oxide, indium tin zinc oxide or amorphous silicon, which will not be defined herein.

To be specific, when the source 03 and the drain 04 are made of copper, the heating temperature for annealing treatment of the base substrate is usually set to a temperature ranging from 300 Celsius degrees to 350 Celsius degrees optimally; and when the source 03 and the drain 04 are made of titanium or molybdenum, the heating temperature for annealing treatment of the base substrate is usually set to a temperature below 300 Celsius degrees optimally.

Under these circumstances, in the method for manufacturing the TFT according to the example of the present invention, different heating temperatures are selected during annealing treatment of the base substrate when the source 03 and the drain 04 are made of different materials, so as to thermally diffuse ions of the source 03 and the drain 04 at the ohmic contact between the active layer 02 and the source 03, as well as the drain 04, to the active layer 02, and further to provide the active layer 02 with ions of the source 03 and the drain 04 for changing the components of the active layer 02, which reduces the resistance at the ohmic contact between the active layer 02 and the source 03, as well as the drain 04, and guarantees the uniformity and reliability of the TFT.

Figure 3:
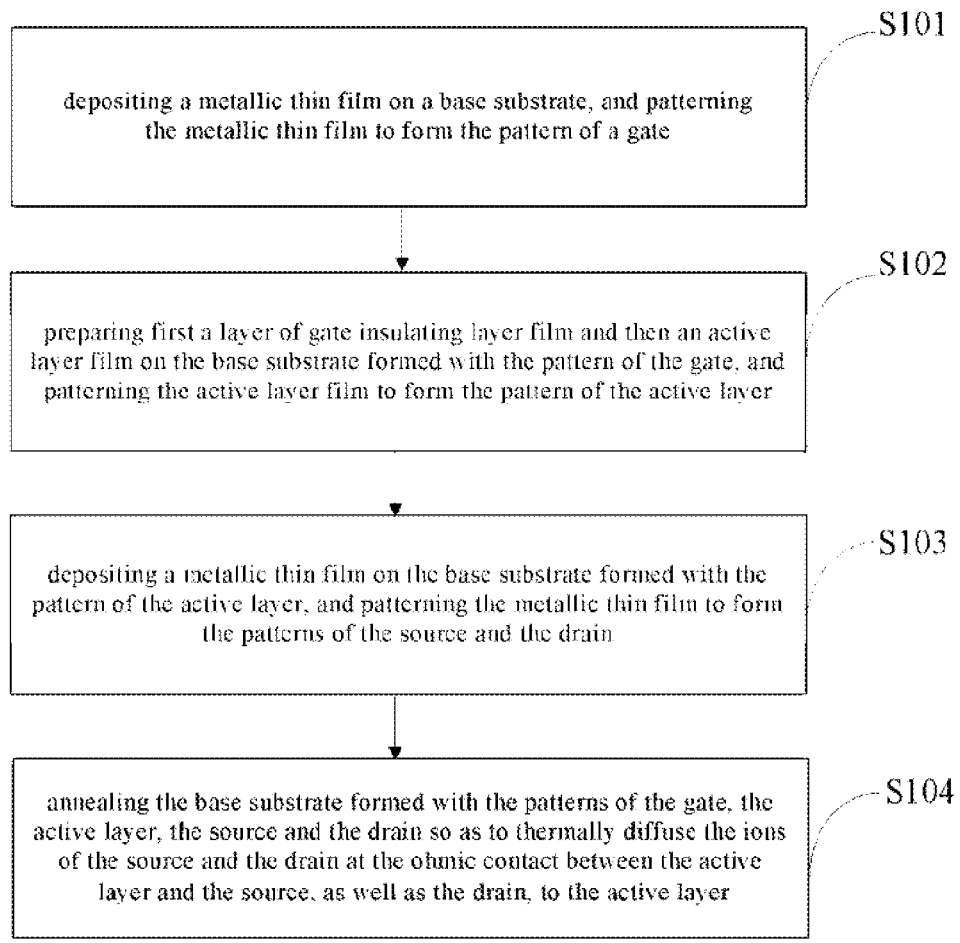
FIG. 3 is a flow chart of the method for manufacturing a TFT according to a further example of the present invention.
Figure 4A:
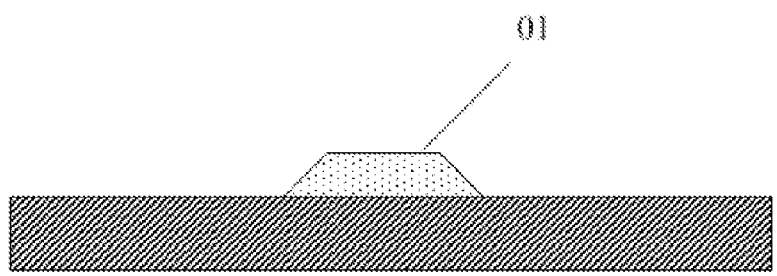
FIGS. 4a to 4d are respectively structural schematic views of the method for manufacturing the TFT according to a yet further example of the present invention after each step is performed.
Figure 4B:
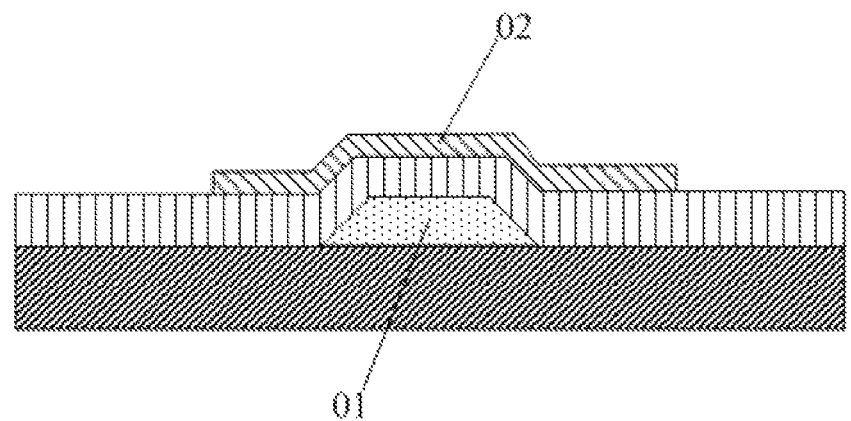
Figure 4C:
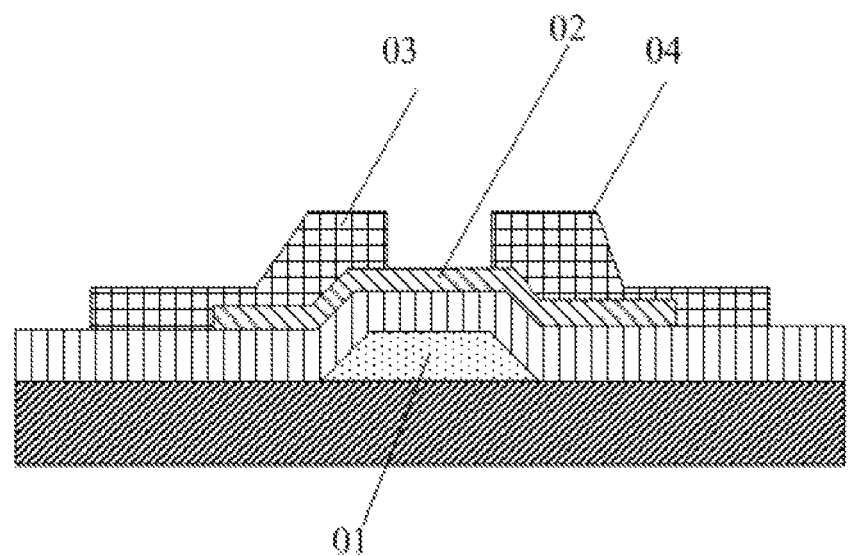
Figure 4D:
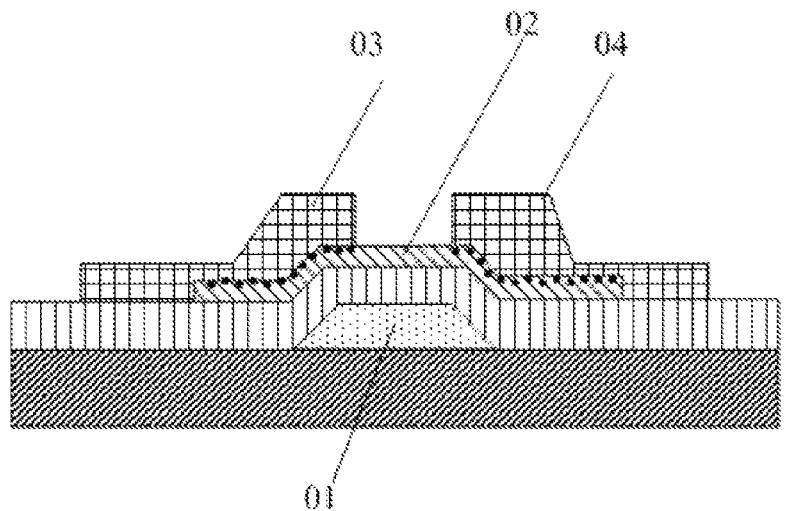

The method according to the example of the present invention will be explained in detail by taking the structure shown in FIG. 2a for example, which, as shown in FIG. 3, comprises the steps of:

S101: depositing a metallic thin film on a base substrate, patterning the metallic thin film to form the pattern of a gate 01, as shown in FIG. 4a;

S102: preparing first a layer of gate insulating layer film and then an active layer film on the base substrate formed with the pattern of the gate 01, and patterning the active layer film to form the pattern of the active layer 02, as shown in FIG. 4b;

S103: depositing a metallic thin film on the base substrate formed with the pattern of the active layer 02, and patterning the metallic thin film to form the patterns of the source 03 and the drain 04, as shown in FIG. 4c;

S104: annealing the base substrate formed with the patterns of the gate 01, the active layer 02, the source 03 and the drain 04 so as to thermally diffuse the ions of the source 03 and the drain 04 at the ohmic contact between the active layer 02 and the source 03, as well as the drain 04, to the active layer 02, as shown in FIG. 4d.

On the basis of the same invention concept, another example of the present invention provides a TFT made by the method for manufacturing the TFT of the present invention as stated above.

Figure 5:
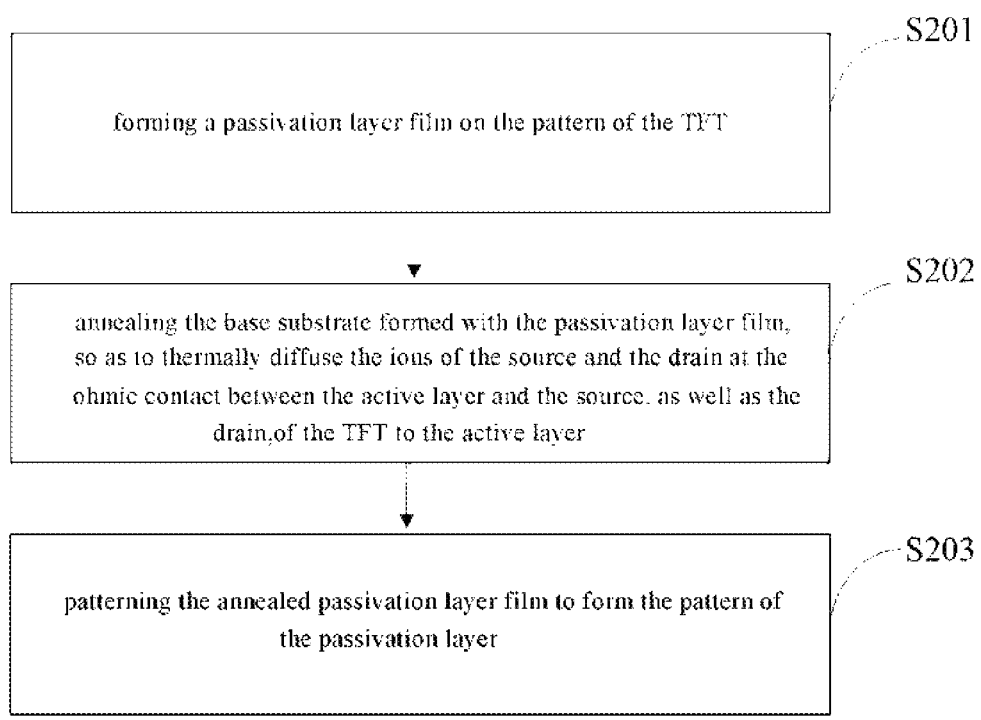
FIG. 5 is a flow chart of the method for manufacturing a passivation layer in the array substrate according to an example of the present invention.
Figure 6A:
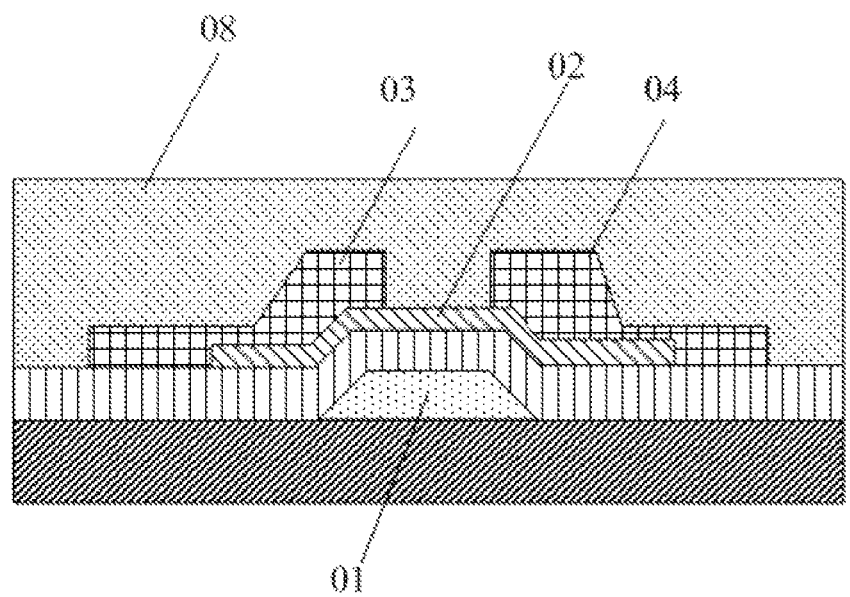
FIGS. 6a to 6d are respectively structural schematic views of the method for manufacturing the array substrate according to another example of the present invention after each step is performed.
Figure 6B:
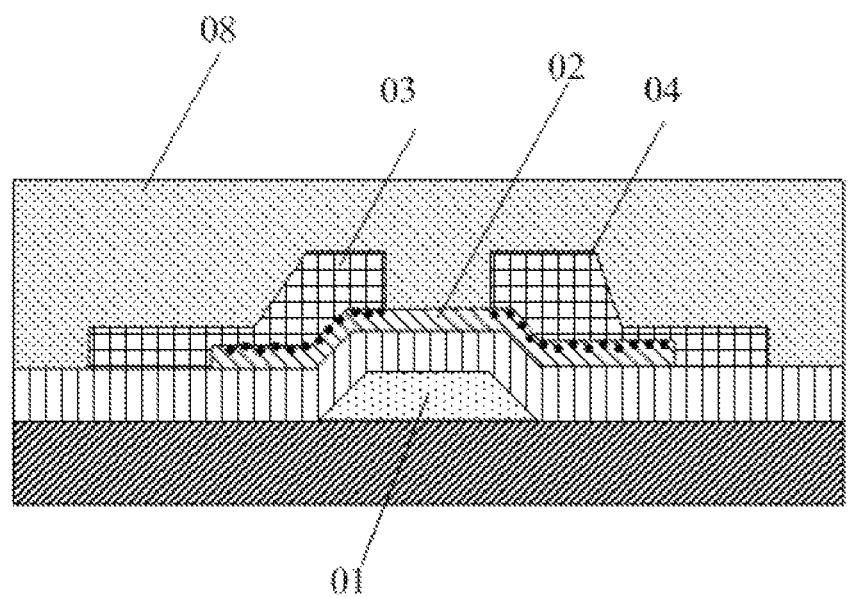
Figure 6C:
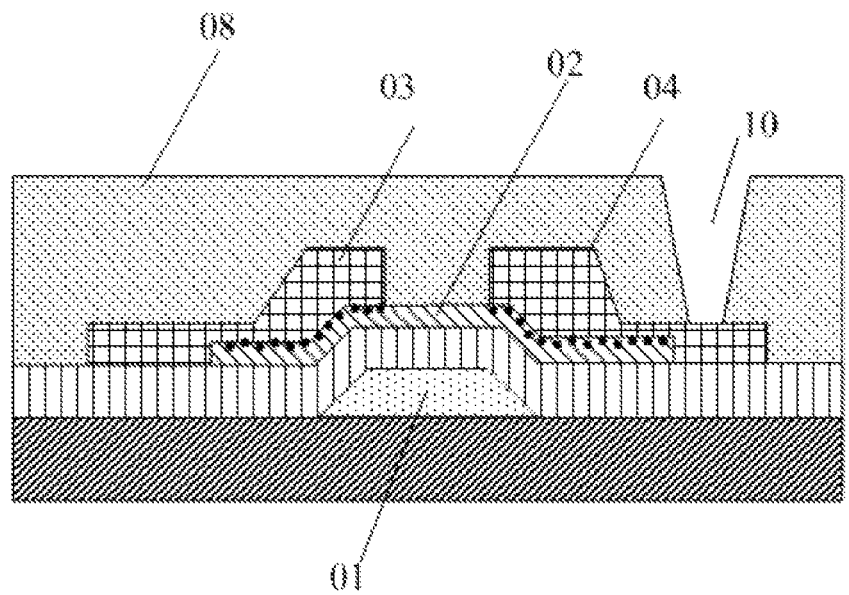

On the basis of the same invention concept, a further example of the present invention provides a method for manufacturing an array substrate, comprising the steps of: forming a pattern of a TFT on a base substrate, forming patterns of a passivation layer and a pixel electrode in turn on the pattern of the TFT, wherein the step of forming the pattern of the passivation layer, as shown in FIG. 5, specifically comprising the steps of:

S201: forming a passivation layer film 08 on the pattern of the TFT, as shown in FIG. 6a;

S202: annealing the base substrate formed with the passivation layer film 08, so as to thermally diffuse the ions of the source 03 and the drain 04 at the ohmic contact between the active layer 02 and the source 03, as well as the drain 04, of the TFT to the active layer 02, as shown in FIG. 6b; and during the annealing treatment after the formation of the passivation layer film 08, the passivation layer film 08 isolating the source 03 and the drain 04 from oxygen so as to prevent the source 03 and the drain 04 from oxidization reaction during the annealing treatment;

S203: patterning the annealed passivation layer film 08 to form the pattern of the passivation layer, as shown in FIG. 6c, wherein the passivation layer has through holes 10 for connecting the drain 04 and the later-formed pixel electrode 09.

Figure 6D:
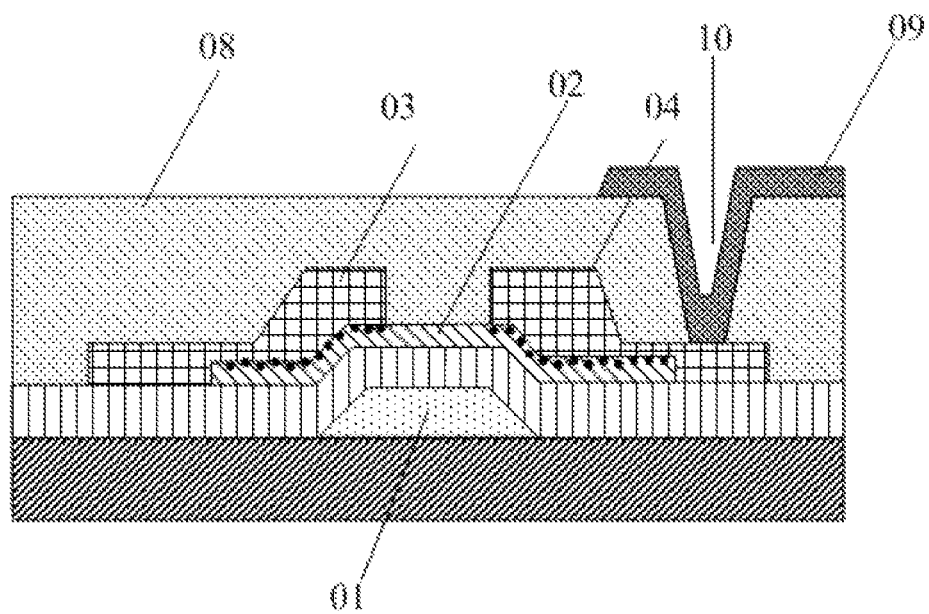

The array substrate made by the method for manufacturing the array substrate according to an example of the present invention is shown in FIG. 6d.

On the basis of the same invention concept, another example of the present invention provides an array substrate made by the method for manufacturing the array substrate according to the present invention as stated above.

The various examples of the present invention provide a method for manufacturing a TFT and an array substrate, and corresponding devices. In the TFT manufacturing process, the base substrate is annealed after the formation of the patterns of the active layer, the source and the drain in the TFT, so as to thermally diffuse ions of the source and the drain at the ohmic contact between the active layer and the source, as well as the drain, to the active layer, and further to provide the active layer with ions of the source and the drain for changing the components of the active layer, which reduces the resistance at the ohmic contact between the active layer and the source, as well as the drain, and guarantees the uniformity and reliability of the TFT. Moreover, annealing treatment is relatively simpler in implementation as compared with the plasma treatment, and will not increase the complexity of the method for manufacturing the entire TFT, which is good for TFT production efficiency.

Apparently, those skilled in the art can make various modifications and variations to the present invention without departing from the spirit and scope of the present invention. If these modifications and variations of the present invention are within the scope of the claims of the present invention and equivalent technologies thereof, the present invention is also intended to include these modifications and variations.

The invention claimed is:

1. A method for manufacturing a thin film transistor comprising:
    forming patterns of a gate, an active layer, a source, and a drain on a base substrate, wherein the source and the drain are in an electrical connection with the active layer; and
    annealing the base substrate after the formation of the patterns of the active layer, after the formation of the patterns of the source, and after the formation of patterns of the drain to thermally diffuse ions of the source at an ohmic contact between the active layer and the source, and to thermally diffuse ions of the drain at an ohmic contact between the active layer and the drain, and preventing the source and the drain from oxidation during the annealing the base substrate, so as to reduce the resistance at the ohmic contacts;
    wherein the annealing the base substrate comprises: heating the base substrate for 20 minutes to 60 minutes in a nitrogen environment without active gas, an inert gas environment or a vacuum environment; and cooling the base substrate to a room temperature.

2. The method of claim 1 wherein the source is made of one of copper, titanium, or molybdenum;
    wherein the drain is made of one of copper, titanium, or molybdenum;
    wherein the active layer is made of semi-conductive oxides.

3. The method of claim 2 wherein:
    the heating temperature of the base substrate is between 300° C. and 350° C. when both the source and the drain are made of copper; or
    the heating temperature of the base substrate is below 300° C. when the source is made of one of titanium or molybdenum, and the drain is made of one of titanium or molybdenum.

4. The method of claim 2 wherein one of:
    the pattern of the source and the pattern of the drain are formed after the formation of the pattern of the active layer; or
    the pattern of the active layer is formed after the formation of both the pattern of the source and the pattern of the drain.

5. The method of claim 3 wherein one of:
    the pattern of the source and the pattern of the drain are formed after the formation of the pattern of the active layer; or
    the pattern of the active layer is formed after the formation of both the pattern of the source and the pattern of the drain.

6. The method of claim 1 wherein one of:
    the pattern of the source and the pattern of the drain are formed after the formation of the pattern of the active layer; or
    the pattern of the active layer is formed after the formation of both the pattern of the source and the pattern of the drain.

7. A method for manufacturing an array substrate comprising:
    providing a base substrate; and
    forming a thin film transistor according to the method of claim 1 on the base substrate.

8. The method of claim 6 wherein after the formation of the pattern of the active layer and before the formation of both the pattern of the source and the pattern of the drain, the method further comprises:
    forming a pattern of an insulating layer on the base substrate wherein the pattern of the active layer, the pattern of the source, and the pattern of the drain are formed electrically connected with the active layer by through-holes in the insulating layer.

* * * * *